United States Patent
Kaneko et al.

(10) Patent No.: US 8,810,040 B2
(45) Date of Patent: Aug. 19, 2014

(54) WIRING SUBSTRATE INCLUDING PROJECTING PART HAVING ELECTRODE PAD FORMED THEREON

(71) Applicant: Shinko Electric Industries Co., Ltd., Nagano (JP)

(72) Inventors: Kentaro Kaneko, Nagano (JP); Kazuhiro Kobayashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 13/681,732

(22) Filed: Nov. 20, 2012

(65) Prior Publication Data
US 2013/0140692 A1    Jun. 6, 2013

(30) Foreign Application Priority Data
Dec. 2, 2011   (JP) .................. 2011-264488

(51) Int. Cl.
| | |
|---|---|
| H05K 1/11 | (2006.01) |
| H01L 23/498 | (2006.01) |
| H05K 1/03 | (2006.01) |
| H01L 23/14 | (2006.01) |
| H05K 3/46 | (2006.01) |
| H05K 3/40 | (2006.01) |
| H05K 3/00 | (2006.01) |

(52) U.S. Cl.
CPC .............. *H05K 1/111* (2013.01); *H05K 3/4682* (2013.01); *H05K 1/032* (2013.01); *H01L 23/49866* (2013.01); *H05K 1/113* (2013.01); *H01L 2224/32225* (2013.01); *H05K 3/4007* (2013.01); *H01L 23/49811* (2013.01); *H01L 23/49822* (2013.01); *H01L 23/145* (2013.01); *H01L 23/49816* (2013.01); *H05K 3/002* (2013.01); *H01L 2224/16225* (2013.01); *H05K 2201/09827* (2013.01); *H01L 2224/73204* (2013.01); *H05K 3/0058* (2013.01)
USPC ............ 257/774; 257/E23.152; 257/E23.194; 257/773; 257/737; 257/738; 257/262; 257/258; 257/260; 29/848; 29/850; 29/842

(58) Field of Classification Search
USPC ........... 257/737.738, 777, 773, 774, E23.152, 257/E23.194, 737, 738; 174/737, 257, 262, 174/267, 260, 261, 250, 258; 29/848, 842, 29/850
See application file for complete search history.

(56) References Cited

U.S. PATENT DOCUMENTS

| | | | | |
|---|---|---|---|---|
| 7,018,705 | B2 * | 3/2006 | Nakatani et al. ............... | 428/209 |
| 7,053,315 | B2 * | 5/2006 | Orui et al. ..................... | 174/267 |
| 7,074,650 | B2 * | 7/2006 | Honda .......................... | 438/108 |

(Continued)

FOREIGN PATENT DOCUMENTS

JP    2006-196860       7/2006

*Primary Examiner* — Alexander Oscar Williams
(74) *Attorney, Agent, or Firm* — IPUSA, PLLC

(57) ABSTRACT

A wiring substrate includes an insulating layer having a first surface on which a projecting part is formed, and an electrode pad being formed on the projecting part and including a first electrode pad surface and a second electrode pad surface on a side opposite to the first electrode pad surface. The first electrode pad surface is exposed from the projecting part of the insulating layer. The second electrode pad surface is covered by the insulating layer. A cross-section of the projecting part is a tapered shape. One side of the cross-section toward the first electrode pad surface is narrower than another side of the cross-section toward the first surface of the insulating layer.

9 Claims, 15 Drawing Sheets

(56) References Cited

U.S. PATENT DOCUMENTS

| | | | |
|---|---|---|---|
| 8,458,900 B2* | 6/2013 | Kodani et al. | 29/832 |
| 8,530,351 B2* | 9/2013 | Nakamura | 438/667 |
| 2005/0056445 A1* | 3/2005 | Orui et al. | 174/52.1 |
| 2006/0131730 A1 | 6/2006 | Nakamura | |
| 2010/0147574 A1* | 6/2010 | Kaneko et al. | 174/261 |
| 2011/0034022 A1* | 2/2011 | Nakamura | 438/613 |

\* cited by examiner

WIRING SUBSTRATE INCLUDING PROJECTING PART HAVING ELECTRODE PAD FORMED THEREON

CROSS-REFERENCE TO RELATED APPLICATIONS

This application is based upon and claims the benefit of priority of the prior Japanese Patent Application No. 2011-264488 filed on Dec. 2, 2011, the entire contents of which are incorporated herein by reference.

FIELD

The embodiments discussed herein are related to a wiring substrate, a method of manufacturing the wiring substrate, and a semiconductor package having a semiconductor chip mounted on the wiring substrate.

BACKGROUND

Conventionally, there is known a so-called built-up wiring substrate in which plural wiring layers and plural insulating layers are alternately layered one on top of the other, and adjacent wiring layers are connected to each other by way of a via hole penetrating an insulating layer sandwiched between the adjacent wiring layers.

In a case of connecting a semiconductor chip to the built-up wiring substrate by using a flip-chip method, the semiconductor chip and the built-up wiring substrate are connected by forming bumps on corresponding electrode pads of the built-up wiring substrate and the semiconductor chip, and bonding the corresponding electrode pads of the built-up wiring substrate and the semiconductor chip.

As described, in, for example, Patent Document 1, the process of forming bumps on the side of the built-up wiring substrate is proposed to be omitted by having the electrode pads of the built-up wiring substrate protrude from a surface of the built-up wiring substrate. In this case, bumps are formed only on the side of the semiconductor chip. Thereby, the bumps formed on the semiconductor chip can be bonded to the electrode pads of the built-up wiring substrate.

Patent Document 1: Japanese Laid-Open Patent Publication No. 2006-196860

In the process for forming electrode pads that protrude from the surface of the built-up wiring substrate, recess parts are formed by etching a support body that is used during the manufacturing of the built-up wiring substrate. Then, electrode pads are formed in the recess parts. Then, the support body is removed. Thereby, the electrode pads that protrude from the surface of the built-up wiring substrate can be formed into shapes corresponding to the shapes of the recess parts.

However, in the case of forming the recess parts, the depths and widths of the recess parts may become different from each other because the recess parts are formed by etching the support body. Thus, the shapes of the recess parts may vary. This also causes the shapes (e.g., height, width) of the electrode pads to vary. As a result, the bonding strengths become different among the electrode pads when mounting the semiconductor chip on the built-up wiring substrate. This leads to degradation of bonding strength (i.e. bonding reliability) between the electrode pads and the semiconductor chip.

SUMMARY

According to an aspect of the invention, there is provided a wiring substrate including an insulating layer having a first surface on which a projecting part is formed, and an electrode pad being formed on the projecting part and including a first electrode pad surface and a second electrode pad surface on a side opposite to the first electrode pad surface, wherein the first electrode pad surface is exposed from the projecting part of the insulating layer, wherein the second electrode pad surface is covered by the insulating layer, wherein a cross-section of the projecting part is a tapered shape, wherein one side of the cross-section toward the first electrode pad surface is narrower than another side of the cross-section toward the first surface of the insulating layer.

The object and advantages of the invention will be realized and attained by means of the elements and combinations particularly pointed out in the claims.

It is to be understood that both the foregoing generation description and the followed detailed description are exemplary and explanatory and are not restrictive of the invention as claimed.

DESCRIPTION OF EMBODIMENTS

Figure 1:
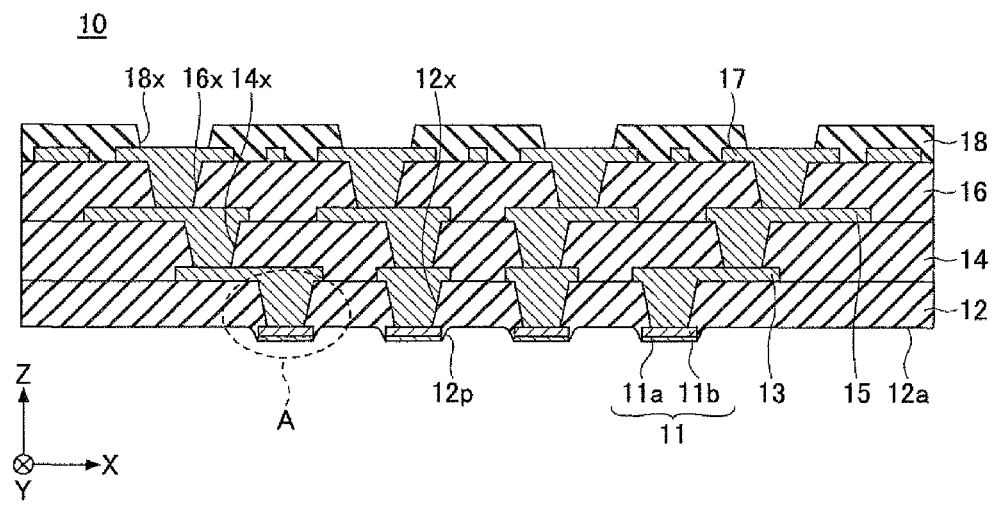
FIG. 1 is a cross-sectional view illustrating a wiring substrate according to a first embodiment of the present invention.
Figure 2:
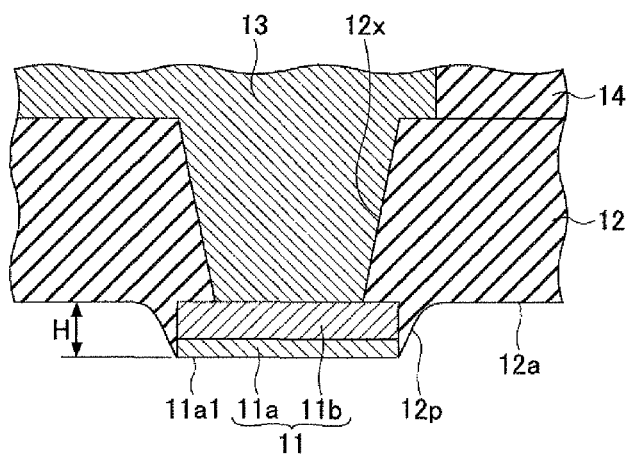
FIG. 2 is an enlarged cross-sectional view of area A of FIG. 1.

In the following, embodiments of the present invention are described with reference to the accompanying drawings.
<First Embodiment>
[Structure of Wiring Substrate of First Embodiment]
First, a structure of a wiring substrate according to the first embodiment of the present invention is described. FIG. 1 is a cross-sectional view illustrating a wiring substrate 10 according to an embodiment of the present invention. FIG. 2 is an enlarged cross-sectional view of area A of FIG. 1.

With reference to FIGS. 1 and 2, the wiring substrate 10 of the first embodiment is a careless built-up wiring substrate including, for example, an electrode pad 11, an insulating layer 12, a wiring layer 13, an insulating layer 14, a wiring layer 15, an insulating layer 16, a wiring layer 17, and a solder resist layer 18.

For the sake of convenience, in this embodiment, the term "lower" or "down" refers to a side toward the insulating layer 12, and the term "upper" or "up" refers to a side toward the solder resist layer 18. For example, a surface of the insulating layer 12 contacting the insulating layer 14 is an upper surface of the insulating layer 12, and a surface of the insulating layer 12 that is exposed (i.e. a surface of the insulating layer 12 apposite to the surface contacting the insulating layer 14) is a lower surface of the insulating layer 12.

In the wiring substrate 10, the electrode pad 11 includes a plating film 11a and a pad body 11b. The plating film 11a is formed on a lower surface of the pad body 11b. The plating film 11a may be, for example, a plating film having a gold (Au) film, a palladium (Pd) film, and a nickel (Ni) film layered in this order, so that the gold film is exposed outward of the wiring substrate 10.

Alternatively, the plating film 11a may be, for example, a plating film having a gold (Au) film and a nickel (Ni) film layered in this order, so that the gold film is exposed outward of the wiring substrate 10. The pad body 11b may be, for example, a conductive layer including a copper layer. The thickness of the electrode pad 11 may be, for example, approximately 10 μm to 20 μm.

The electrode pad 11 is embedded in a projecting part 12p of the insulating layer 12. The projecting part 12p projects from a lower surface 12a of the insulating layer 12. The projecting part 12p is a part of the insulating layer 12 that is integrally formed with other parts of the insulating layer 12. A lower surface of the electrode pad 11 is exposed in the projecting part 12p of the insulating layer 12. Further, a side surface of the electrode pad 11 (i.e. entire side surface of the plating film 11a and entire side surface of the pad body 11b) is covered by the projecting part 12p of the insulating layer 12. Further, an upper surface of the electrode pad 11 excluding a part contacting the below-described via wiring of the wiring layer 13 is also covered by the projecting part 12p.

In other words, although the lower surface of the electrode pad 11 (lower surface of the plating film 11a) is exposed from the projecting part 12p of the insulating layer 12, the lower surface of the electrode pad 11 projects further outward (downward) than the lower surface 12a of the insulating layer 12. However, a part of the side surface of the electrode pad 11 toward the insulating layer 14 and the upper surface of the electrode pad 11 may be covered by another part other than the projecting part 12p of the insulating layer 12. That is, the upper surface of the electrode pad 11 may be positioned more toward the insulating layer 14 than the lower surface 12a of the insulating layer 12.

The cross section of the projecting part 12p may be, for example, a recessed round shape. Alternatively, the cross section of the projecting part 12p may be, for example, a linearly inclined shape. The height H of the projecting part 12p from the lower surface 12a of the insulating layer 12 to a tip of the projecting part 12p (lower surface of the plating film 11a) may be, for example, approximately 10 μm to 50 μm.

In this embodiment, the side of the wiring substrate 10 toward the electrode pad 11 is a side on which a semiconductor chip (not illustrated) is to be mounted. A plan view of the electrode pad 11 may be, for example, a circular shape having a diameter of approximately 40 μm to 120 μm. The pitch between adjacent electrode pads 11 of the wiring substrate 10 may be, for example, approximately 100 μm to 200 μm.

In the electrode pad 11 according to this embodiment, the plating film 11a is formed only on the lower surface of the pad body 11b. This is because the lower surface of the electrode pad 11 is a part of the electrode pad 11 to which a bump is bonded. Thus, by forming the plating film 11a only on the lower surface of the pad body 11b, connection reliability can be improved.

Therefore, in the electrode pad 11 according to this embodiment, the side surface of the pad body 11, which does not contribute to the bonding between the bump and the electrode pad 11, has no plating film 11a formed thereon. As a result, manufacturing cost of the wiring substrate 10 can be reduced because the amount of noble metal used for forming the plating film 11a can be reduced.

The insulating layer 12 (including the projecting part 12p) covers the upper surface of the electrode pad 11 (except for a part contacting the via wiring of the wiring layer 13) and the side surface of the electrode pad 11 and exposes the lower surface of the electrode pad 11 (i.e. surface of the electrode pad 11 opposite to the surface to be connected to the via wiring of the wiring surface 13). For example, an insulating resin having an epoxy type resin as a main component may be used as the material of the insulating layer 12. The insulating resin used in the insulating layer 12 may be, for example, a resin having a thermosetting property (thermosetting resin). The thickness of the insulating layer 12 may be, for example, approximately 15 μm to 35 μm. The insulating layer 12 may include a filler such as silica ($SiO_2$).

The wiring layer 13 is formed on the insulating layer 12. The insulating layer 12 has a via hole 12x penetrating therethrough and exposing an upper surface of the electrode pad 11. The wiring layer 15 includes a via wiring that fills the inside of the via hole 12x and a wiring pattern that is formed on the insulating layer 12. The via hole 12x is open toward the insulating layer 14 (opening part) and has a bottom surface formed by the upper surface of the electrode pad 11 (bottom part). The via hole 12x includes a recess part having a circular conical shape in which the opening part of the via hole 12x has an area larger than the area of the bottom surface of the via hole 12x. The recess part of the via hole 12x has a via wiring formed therein.

The wiring layer 13 is electrically connected to the electrode pad 11 exposed in the bottom part of the via hole 12x. For example, copper (Cu) may be used as the material of the wiring layer 13. The thickness of a wiring pattern constituting the wiring layer 13 may be, for example, approximately 10 μm to 20 μm.

The insulating layer 14 is formed on the insulating layer 12 and covers the wiring layer 13. The material of the insulating layer 14 may be the same as the material of the insulating layer 12. The thickness of the insulating layer 14 may be, for example, approximately 15 μm to 35 μm. The insulating layer 14 may include a filler such as silica ($SiO_2$).

The wiring layer 15 is formed on the insulating layer 14. The insulating layer 14 has a via hole 14x penetrating therethrough and exposing an upper surface of the wiring layer 13. The wiring layer 15 includes a via wiring that fills the inside of the via hole 14x and a wiring pattern that is formed on the insulating layer 14. The via hole 14x is open toward the insulating layer 16 (opening part) and has a bottom surface formed by the upper surface of the wiring layer 13 (bottom part). The via hole 14x includes a recess part having a circular conical shape in which the opening part of the via hole 14x has an area larger than the area of the bottom surface of the via hole 14x. The recess part of the via hole 14x has a via wiring formed therein.

The wiring layer 15 is electrically connected to the wiring layer 13 exposed in the bottom part of the via hole 14x. For example, copper (Cu) may be used as the material of the wiring layer 15. The thickness of a wiring pattern constituting the wiring layer 15 may be, for example, approximately 10 μm to 20 μm.

The insulating layer 16 is formed on the insulating layer 14 and covers the wiring layer 15. The material of the insulating layer 16 may be the same as the material of the insulating layer 12 and the insulating layer 14. The thickness of the insulating layer 16 may be, for example, approximately 15 μm to 35 μm. The insulating layer 16 may include a filler such as silica ($SiO_2$).

The wiring layer 17 is formed on the insulating layer 16. The insulating layer 16 has a via hole 16x penetrating therethrough and exposing an upper surface of the wiring layer 15. The wiring layer 17 includes a via wiring that fills the inside of the via hole 16x and a wiring pattern that is formed on the insulating layer 16. The via hole 16x is open toward the solder resist layer 18 (opening part) and has a bottom surface formed by the upper surface of the wiring layer 15 (bottom part). The via hole 16x includes a recess part having a shape of a circular truncated cone. The opening part of the via hole 16x has an area larger than the area of the bottom surface of the via hole 16x. The recess part of the via hole 16x has a via wiring formed therein.

The wiring layer 17 is electrically connected to the wiring layer 15 exposed in the bottom part of the via hole 16x. For example, copper (Cu) may be used as the material of the wiring layer 17. The thickness of a wiring pattern constituting the wiring layer 17 may be, for example, approximately 10 μm to 20 μm.

The solder resist layer 18 is formed on the insulating layer 16 and covers the wiring layer 17. The solder resist layer 18 includes an opening part 18x. A part of the wiring layer 17 is exposed in a bottom part of the opening part 18x. The wiring layer 17, which has a part exposed in the bottom part of the opening part 18x, functions as an electrode pad that is to be electrically connected to a mounting substrate (not illustrated) such as a motherboard.

According to necessity, a metal layer may be formed on the part of the wiring layer 17 exposed in the bottom part of the opening part 18x. The metal layer may be formed by using, for example, an electroless plating method. The metal layer may be, for example, a gold (Au) layer, a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order).

Further, an external connection terminal such as a solder ball or a lead pin may be formed on the wiring layer 17 exposed in the bottom part of the opening part 18x. In the case where the metal layer is formed on the part of the wiring layer 17 exposed in the bottom part of the opening part 18x, the external connection terminal may be formed on the metal layer. The external connection terminal acts as a terminal that electrically connects the wiring substrate 10 to the mounting substrate (not illustrated) such as a motherboard. Alternatively, the wiring layer 17 exposed in the bottom part of the opening part 18x may be used as an external connection terminal. In the case where the metal layer is formed on the part of the wiring layer 17 exposed in the bottom part of the opening part 18x, the metal layer may be used as an external connection terminal.

The part of the wiring layer 17 exposed on the bottom part of the opening part 18x may also be hereinafter referred to as "electrode pad 17". In this embodiment, the side of the wiring substrate 10 toward the electrode pad 17 is a side of the wiring substrate 10 to which a mounting substrate such as a motherboard is to be mounted. The plan view of the electrode pad 17 may be, for example, a circular shape having a diameter of approximately 200 μm to 1000 μm. The pitch between adjacent electrode pads 17 may be wider than the pitch of the electrode pads 11 (e.g., approximately 100 μm to 200 μm). For example, the pitch between adjacent electrode pads 17 may be approximately 500 μm to 1200 μm.

In the wiring substrate 10 according to this embodiment, the wiring pattern constituting the wiring layer 17 may be formed extending onto the insulating layer 16 and exposed in the opening part 18x of the solder resist layer 18, so that the wiring pattern serves as the electrode pad 17. In other words, a part of the wiring layer 17 other than the part of the wiring layer 17 formed on the via hole 16x may be used as the wiring pad 17.

[Method for Manufacturing Wiring Substrate of First Embodiment]

Next, a method for manufacturing a wiring substrate according to the first embodiment of the present invention is described. FIGS. 3-11 are schematic diagrams for describing the processes in manufacturing the wiring substrate according to the first embodiment of the present invention.

Figure 3:
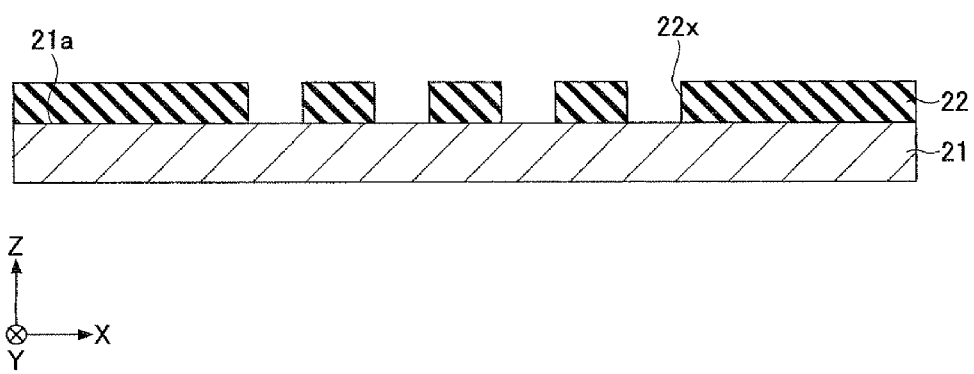
FIGS. 3-11 are schematic diagrams for describing the processes in manufacturing the wiring substrate according to the first embodiment of the present invention.

First, in the process illustrated in FIG. 3, a support body 21 having a flat first surface 21a is prepared. A resist layer 22 is formed on the first surface 21a of the support body 21. The resist layer 22 includes one or more opening parts (in the embodiment illustrated in FIG. 3, multiple opening parts) 22x corresponding to one or more electrode pads 11 formed in the below-described process illustrated in FIG. 4. Although a silicon substrate, glass substrate, a metal substrate, or a metal foil may be used as the support body 21, this embodiment uses copper foil as the support body 21. The copper foil is used as the support body 21 because the copper foil can be used as a power-feeding layer for performing electroplating in the below-described process illustrated in FIG. 4, and because the copper foil can be easily removed by etching in the below-described process illustrated in FIG. 11. The thickness of the support body 21 may be, for example, approximately 35 μm to 100 μm.

In order to form the resist layer 22, a liquid or paste-like resin formed of a photosensitive resin compound is applied to the first surface 21a of the support body 21. The photosensitive resin compound of the liquid or paste-like resist may include, for example, an epoxy type resin or an acrylic type resin. Alternatively, a film-like resin (e.g., dry film resist) formed of a photosensitive resin compound may be laminated on the first surface 21a of the support body 21.

The opening parts 22x, which are formed in correspondence with the electrode pads 11, are arranged in a pitch of, for example, approximately 100 μm to 200 μm. The opening part 22x may have, for example, a circular shape from plan view. The diameter of the circular-shaped opening part 22x may be, for example, approximately 40 μm to 120 μm.

Figure 4:
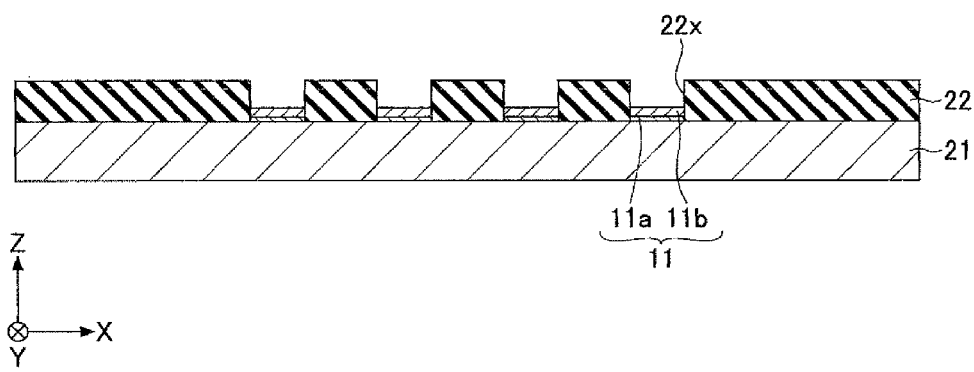

Then, in the process illustrated in FIG. 4, one or more electrode pads (in the embodiment illustrated in FIG. 4, multiple electrode pads) 11 are formed in corresponding opening part(s) 22x on the first surface 21a of the support body 21. The electrode pad 11 has layers including a plating film 11a and a pad body 11b. In this embodiment, the electrode pads 11 are formed by an electroplating method using the support body 21 as a power-feeding layer.

The plating film 11a has a layered structure in which a gold (Au) film, a palladium (Pd) film, and a nickel (Ni) film are layered in this order. Therefore, the plating film 11a is formed by performing an electroplating process using the support body 21 as the power-feeding layer, so that a gold (Au) film, a palladium (Pd) film, and a nickel (Ni) film are plated in this order. Then, the pad body 11b (e.g., formed of copper (Cu)) is formed on the plating film 11a by performing an electroplating process using the support body 21 as the power-feeding layer. Alternatively, the plating film 11a may have a layered structure having a gold (Au) film and a nickel (Ni) film layered in this order.

Figure 5:
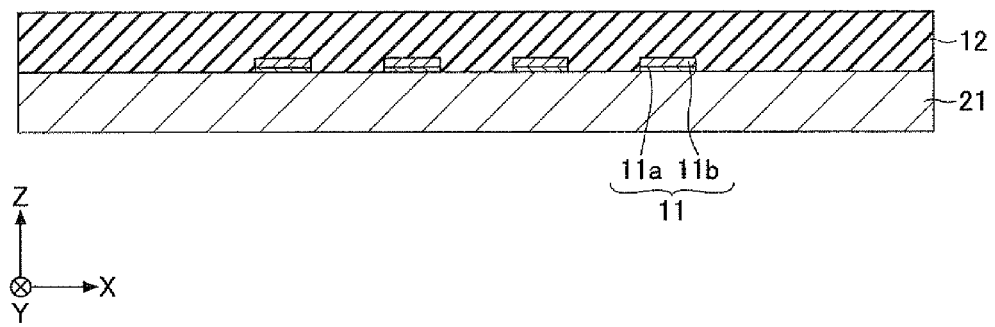

Then, in the process illustrated in FIG. 5, an insulating layer 12 is formed on the first surface 21a of the support body 21 after removing the resist layer 22 illustrated in FIG. 4. The insulating layer 12 formed on the first surface 21a covers the electrode pads 11. For example, a material having an epoxy type resin as a main component may be used as the material of the insulating layer 12. The thickness of the insulating layer 12 may be, for example, approximately 15 μm to 35 μm. The insulating layer 12 may include a filler such as silica ($SiO_2$).

In a case where, for example, a film-like thermosetting insulating resin having an epoxy type resin as a main component is used as the material of the insulating layer 12, the insulating layer 12 is formed as follows. An insulating resin film being in a semi-cured state is laminated on the first surface 21a of the support body 21. The laminated insulating resin covers the electrode pads 11. Then, the laminated insulating resin is cured by applying a pressing force to the laminated insulating resin while heating the laminated insulating resin to a temperature greater than or equal to a thermosetting temperature. Thereby, the insulating layer 12 is formed. It is to be noted that generation of voids can be prevented by laminating the insulating resin in a vacuum atmosphere.

In a case where, for example, a liquid or a paste-like thermosetting insulating resin having an epoxy type resin as a main component is used as the material of the insulating layer 12, the insulating layer 12 is formed as follows. An insulating resin liquid or paste is applied on the first surface 21a of the support body 21 by using, for example, a spin-coating method. The applied insulating resin covers the electrode pads 11. Then, the applied insulating resin is cured by heating the applied insulating resin to a temperature greater than or equal to a thermosetting temperature. Thereby, the insulating layer 12 is formed.

Figure 6:
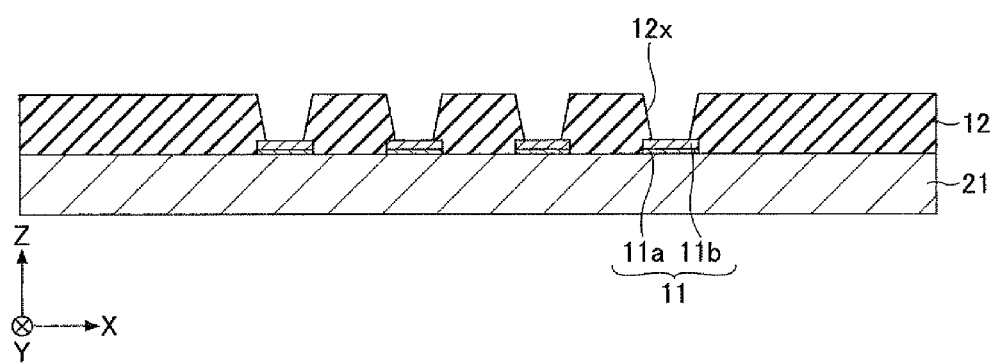

Then, in the process illustrated in FIG. 6, one or more via holes 12x, which penetrate the insulating layer 12 and expose the upper surface of the electrode pads 11, are formed in the insulating layer 12. The via hole 12x may be formed by, for example, a laser processing method using a $CO_2$ laser. The via hole 12x formed by the laser processing method includes a recess part having a shape of a circular truncated cone. The via hole 12x has an opening part toward the insulating layer 14 and a bottom surface part on the upper surface of the electrode pad 11. The area of the opening part of the via hole 12x is larger than the area of the bottom surface part of the via hole 12x.

Other via holes may also be formed with the same shapes as the via holes 12x by using the same laser processing method for forming the via holes 12x. In a case where the via hole 12x is formed by using the laser processing method, it is preferable to remove residual resin of the insulating layer 12 adhered to the upper surface of the electrode pad 11 exposed in the bottom part of the via hole 12x. In this case, a desmearing process may be used to remove the residual resin of the insulating layer 12.

Figure 7:
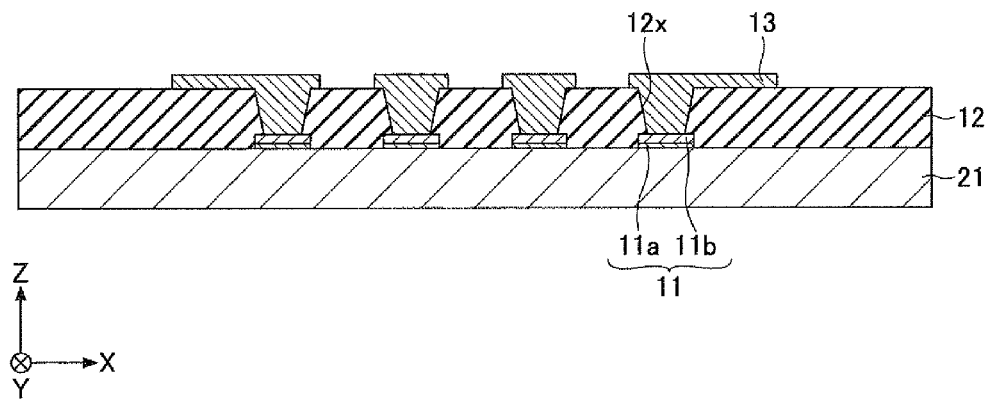

In the process illustrated in FIG. 7, a wiring layer 13 is formed on the insulating layer 12. The wiring layer 13 includes a via wiring and a wiring pattern. The via wiring fills the inside of the via hole 12x. The wiring pattern is formed on the insulating layer 12. The wiring layer 13 is electrically connected to the electrode pad 11 exposed on the bottom part of the via hole 12x. For example, copper (Cu) may be used as the material of the wiring layer 13.

Although the wiring layer 13 may be formed by using various wiring forming methods (e.g., semi-additive method, subtractive method), an example of forming the wiring layer 13 with the semi-additive method is described below.

First, a seed layer (not illustrated) is formed on the upper surface of the electrode pad 11 exposed in the bottom part of the via hole 12x and the insulating layer 12 including the sidewall of the via hole 12x. The seed layer, which is formed of, for example, copper (Cu), may be formed by performing an electroless plating method or a sputtering method. Then, a resist layer (not illustrated) having an opening part corresponding to the wiring layer 13 is formed on the seed layer. Then, a wiring layer (not illustrated), which is formed of, for example, copper (Cu), is formed in the opening part of resist layer. The wiring layer is formed by an electroplating method using the seed layer as the power-feeding layer. Then, after removing the resist layer, a part of the seed layer that is not covered by the wiring layer is removed by using the wiring layer as a mask and etching the part of the seed layer that is not covered by the wiring layer. Thereby, the wiring layer 13 including the via wiring (filling the inside of the via hole 12x) and the wiring pattern (being formed on the insulating layer 12) is formed on the insulating layer 12.

Figure 8:
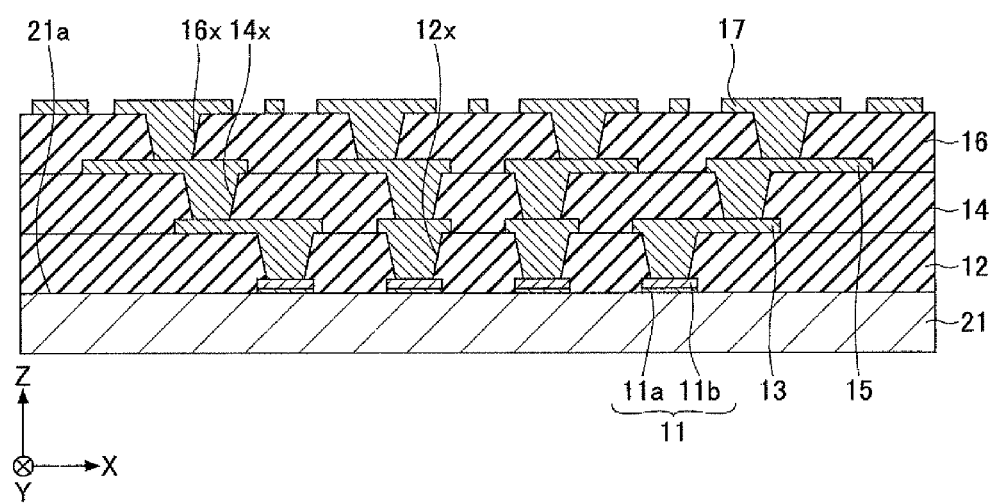

Then, in the process illustrated in FIG. 8, by repeating the above-described processes illustrated in FIGS. 3-7, the insulating layer 14, the wiring layer 15, the insulating layer 16, and the wiring layer 17 are layered on the insulating layer 12 as illustrated in FIG. 8. That is, the via hole 14x, which penetrates the insulating layer 14 and exposes the upper surface of the wiring layer 13, is formed after the insulating layer 14 covering the wiring layer 13 is formed on the insulating layer 12. The material of the insulating layer 14 may be the same insulating resin used for forming the insulating layer 12. The thickness of the insulating layer 14 may be, for example, approximately 15 μm to 35 μm. The insulating layer 14 may include a filler such as silica ($SiO_2$).

Then, a wiring layer 15 is formed on the insulating layer 14. The wiring layer 15 is connected to the wiring layer 13 by way of the via hole 14x. The wiring layer 15 includes a via wiring that fills the inside of the via hole 14x and the wiring layer that is formed on the insulating layer 14. The wiring layer 15 is electrically connected to the wiring layer 13 exposed in the bottom part of the via hole 14x. For example, copper (Cu) may be used as the material of the wiring layer 15. The wiring layer 15 may be formed by using, for example, a semi-additive method. The thickness of the wiring pattern of the wiring layer 15 may be, for example, approximately 10 μm to 20 μm.

Then, a via hole 16x, which penetrates the insulating layer 16 and exposes the upper surface of the wiring layer 15, is formed after the insulating layer 16 covering the wiring layer 15 is formed on the insulating layer 14. The material of the insulating layer 16 may be the same insulating resin used for forming the insulating layer 14. The thickness of the insulating layer 16 may be, for example, approximately 15 μm to 35 μm. The insulating layer 16 may include a filler such as silica ($SiO_2$).

Then, a wiring layer 17 is formed on the insulating layer 16. The wiring layer 17 is connected to the wiring layer 15 by way of the via hole 16x. The wiring layer 17 includes a via wiring that fills the inside of the via hole 16x and the wiring layer that is formed on the insulating layer 16. The wiring layer 17 is electrically connected to the wiring layer 15 exposed in the bottom part of the via hole 16x. For example, copper (Cu) may be used as the material of the wiring layer 17. The wiring layer 17 may be formed by using, for example, a semi-additive method. The thickness of the wiring pattern of the wiring layer 17 may be, for example, approximately 10 μm to 20 μm.

Thereby, a predetermined built-up wiring structure is formed on the first surface 21a of the support body 21. Although a built-up wiring structure including 3 layers (wiring layers 13, 15, and 17) is formed in the above-described embodiment, a built-up wiring structure including n layers ("n" being an integer greater than or equal to 1) may be formed.

Figure 9:
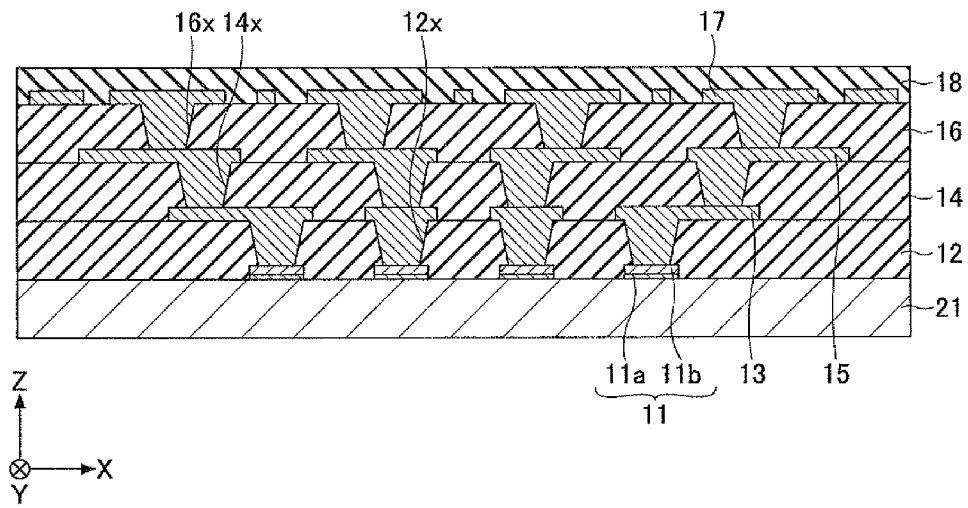

Then, in the process illustrated in FIG. 9, a solder resist layer 18 covering the wiring layer 17 is formed on the insulating layer 16. The solder resist layer 18 is formed covering the wiring layer 17 by applying a liquid or paste-like photosensitive insulating resin on the insulating layer 16 by using a screen-printing method, a roll-coating method, or a spin-coating method. Alternatively, the solder resist layer 18 may be formed covering the wiring layer 17 by laminating a film-like photosensitive insulating resin on the insulating layer 16.

An opening part 18x is formed by exposing and developing the applied or laminated insulating resin (photolithographic method) of FIG. 9. Thereby, the solder resist layer 18 including the opening part 18x can be formed. Alternatively, a film-like insulating resin having the opening part 18x formed beforehand may be laminated on the insulating layer 16 and cover the wiring layer 17. Alternatively, a non-photosensitive insulating resin may be used as the material of the solder resist layer 18. In the case where the non-photosensitive insulating resin is used, the opening part 18x is formed by, for example, a laser processing method using a $CO_2$ laser or performing a blasting process using a polishing agent (e.g., alumina abrasive grain) after the solder resist layer 18 is formed on the insulating layer 16 and cured.

Figure 10:
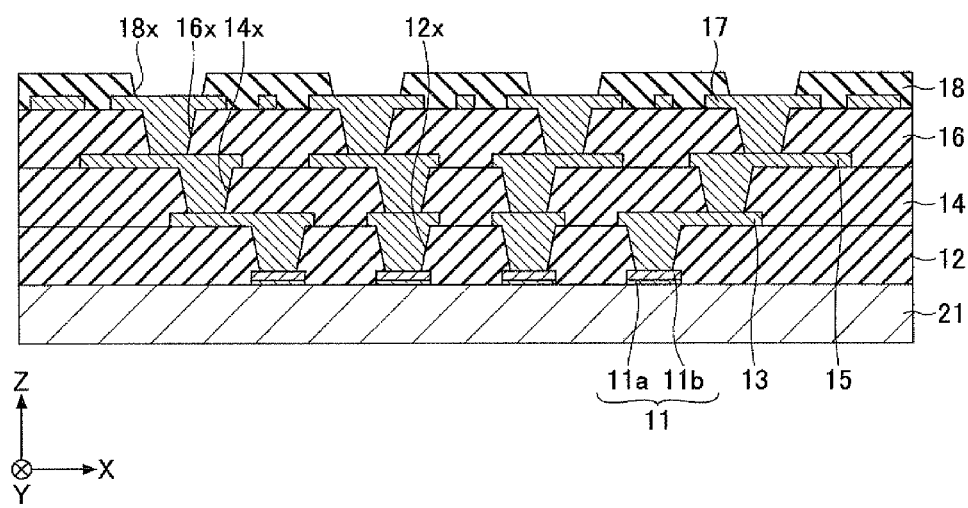

By the completing the process illustrated in FIG. 10, the solder resist layer 18 including the opening part 18x is formed, and a part of the wiring layer 17 is exposed in the opening part 18x. The part of the wiring layer 17 (electrode pad 17) exposed in the opening part 18x functions as an electrode pad to be electrically connected to a pad provided on a mounting substrate (not illustrated) such as a motherboard.

According to necessity, a metal layer may be formed on the wiring layer 17 exposed in the bottom part of the opening part 18x by using, for example, an electroless plating method. The metal layer may be, for example, a gold layer (Au), a nickel/gold (Ni/Au) layer (i.e. metal layer including a Ni layer and a Au layer layered in this order), or a nickel/palladium/gold (Ni/Pd/Au) layer (i.e. metal layer including a Ni layer, a Pd layer, and a Au layer layered in this order).

Figure 11:
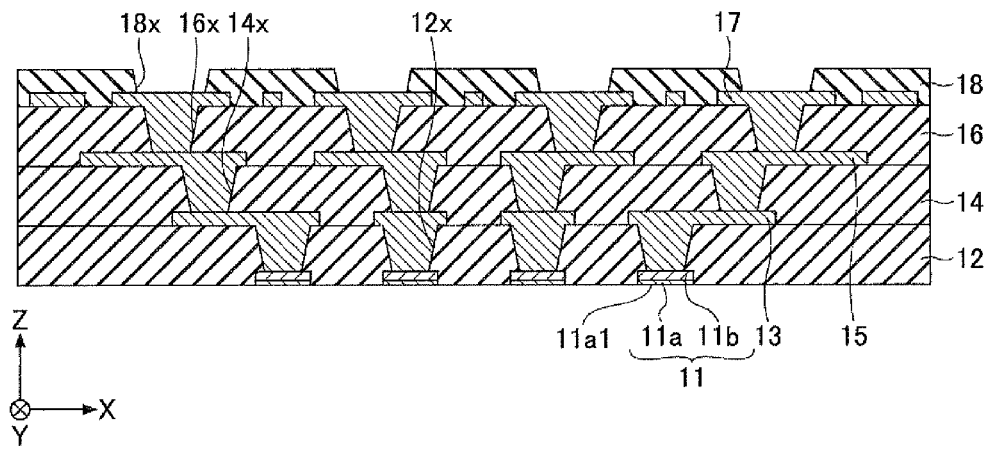

Then, in the process illustrated in FIG. 11, the support body 21 is removed. Thereby, a lower surface 11a1 of the plating film 11a is exposed in the insulating layer 12. The lower surface of the plating film 11a exposed in the insulating layer 12 may also be hereinafter referred to as an exposed surface 11a1 of the plating film 11a. The support body 21, which is formed of copper foil, may be removed by performing wet-etching with an etching liquid such as a ferric chloride solution, a cupric chloride solution, or an ammonium persulfate solution.

In performing the wet-etching, the support body 21, which is formed of copper foil, can be selectively etched (i.e. wet-etching the support body 21 only) owing to, for example, a gold (Au) film being the outermost layer of the electrode pad 11 exposed from the insulating layer 12. However, in a case where the wiring layer 17 is formed of copper (Cu), the wiring layer 17 is to be masked for preventing the wiring layer 17 exposed in the bottom part of the opening part 18x from being etched together with the support body 21.

Then, after the process illustrated in FIG. 11, a part of the lower surface 12a of the insulating layer 12 surrounding the periphery of the exposed surface 11a1 of the plating film 11a is removed by etching. That is, the thickness of the part of the insulating layer 12 surrounding the periphery of the exposed surface 11a1 of the plating film 11a is reduced. As a result, a projecting part 12p is formed on the lower surface 12a of the insulating layer 12, and the exposed surface 11a1 of the plating film 11a projects further outward (downward) than the lower surface 12a of the insulating layer 12. Thereby, the manufacturing of the wiring substrate 10 illustrated in FIGS. 1 and 2 is completed. The projecting part 12p may be formed by a laser processing method using, for example, a $CO_2$ laser or a YAG laser. Alternatively, a grinding method using various blasting processes (e.g., wet-blast) may be used to form the projecting part 12p. By controlling the amount of etching, the height H of the projecting part 12p can be adjusted. In this embodiment, the projecting part 12p is formed after forming the electrode pad 11 (including the plating film 11a and the pad body 11b). Therefore, unlike the related art example, the plating film 11a can be prevented from being formed on the side surface of the pad body 11b of the electrode pad 11.

After the process illustrated in FIG. 11, an external connection terminal (e.g., solder ball, lead pin) may be formed on the wiring layer 17 exposed in the bottom part of the opening part 18x (or formed on a metal layer in a case where the metal layer is formed on the wiring layer 17 exposed in the bottom part of the opening part 18x). The external connection terminal is for electrically connecting to a mounting substrate (not illustrated) such as a motherboard. Alternatively, the wiring layer 17 itself exposed in the bottom part of the opening part 18x may be used as an external connection terminal (or a metal layer in a case where the metal layer is formed on the wiring layer 17 exposed in the bottom part of the opening part 18x). Alternatively, an external connection terminal (e.g., solder ball, lead pin) may be formed before the support body 21 is removed.

Although an example of forming a single wiring substrate 10 on the support body 21 is described above with FIGS. 3-11, a material corresponding to multiple wiring substrates 10 may be formed on the support body 21 and cut into individual pieces (wiring substrates 10) after the process of removing the support body 21. Thereby, multiple wiring substrates 10 can be obtained.

Hence, in the above-described first embodiment, the electrode pad 11 is formed on the first surface 21a of the support body 21, and the thickness of a part of the insulating layer 12 surrounding the periphery of the electrode pad 11 is reduced by removing (e.g., etching) the part of the insulating layer 12 surrounding the periphery of the electrode pad 11. Thereby, the projecting part 12p is formed on the lower surface 12a of the insulating layer 12, and the lower surface of the electrode pad 11 (i.e. exposed surface 11a1 of the plating film 11) projects further outward (downward) than the lower surface 12a of the insulating layer 12. Further, the lower surfaces of the electrode pads 11 (i.e. exposed surface 11a1 of the plating films 11) are positioned on the same plane, and the electrode pads 11 can be formed having a uniform diameter.

In other words, the electrode pads 11 can be formed having a consistent shape (e.g., equal height, equal width). This prevents inconsistency of bonding strength among the electrode pads 11 in a case of mounting, for example, a semiconductor chip on the wiring substrate 10. As a result, connection reliability between the electrode pad 11 and a semiconductor chip or the like can be improved.

Further, because the lower surface of the electrode pad 11 projects further outward (downward) than the lower surface 12a of the insulating layer 12, a semiconductor chip can be connected to the wiring substrate 10 by flip-chip bonding if a bump(s) is simply formed on either the electrode pad 11 of the wiring substrate 10 or an electrode pad of the semiconductor chip.

Further, because the projecting part 12p is formed after forming the electrode pad 11 (including the plating film 11a and the pad body 11b), the plating film 11a is prevented from being formed on a side surface of the pad body 11b (i.e. the part of the electrode pad 11 which does not contribute to bonding to a bump). As a result, manufacturing cost of the wiring substrate 10 can be reduced because the amount of noble metal material used for forming the plating film 11a can be reduced compared to the related art example.

[Modified Example of First Embodiment]

In a modified example of the first embodiment, a portion of the side surface of the electrode pad 11 or the entire side surface of the electrode pad 11 is exposed in the projecting part 12p of the insulating layer 12. In the modified example of the first embodiment, like components are denoted with like reference numerals as of the reference numerals of the first embodiment and are not further explained.

Figure 12:
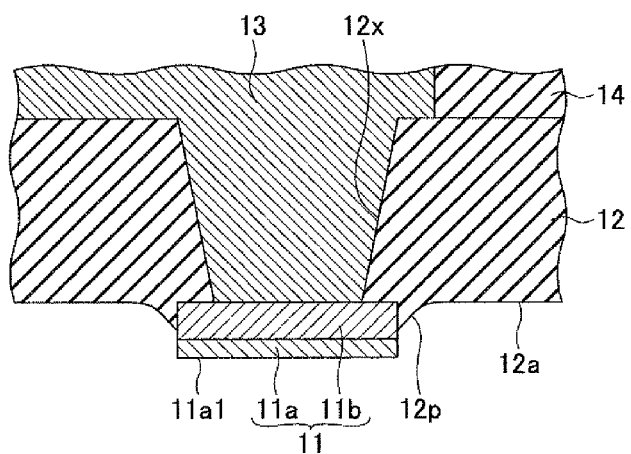
FIGS. 12-14 are cross-sectional views corresponding to FIG. 2 (examples 1-3)
Figure 13:
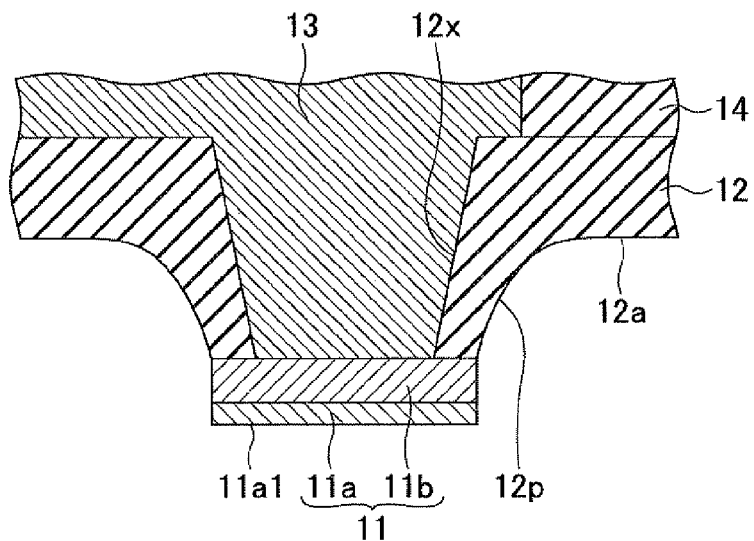

FIG. 12 is a cross-sectional view (example 1) corresponding to FIG. 2. FIG. 13 is a cross-sectional view (example 2) which also corresponds to FIG. 2. As illustrated in FIG. 12, a portion of the side surface of the electrode pad 11 is exposed from the projecting part 12p. Alternatively, as illustrated in FIG. 13, the entire side surface of the electrode pad 11 is exposed from the projecting part 12p. The projecting part 12p may be formed into the shapes illustrated in FIGS. 12 and 13 by adjusting the amount of laser irradiation or the amount of blasting.

In the configuration illustrated in FIG. 13, the projecting part 12p is formed on the lower surface 12a of the insulating layer 12, and the electrode pad 11 is formed on the projecting part 12p. Further, the entire lower surface 11a1 of the plating film 11a, the entire side surface of the plating film 11a, and the entire side surface of the pad body 11b are exposed from the projecting part 12p (insulating layer 12). Further, the upper surface (excluding a part of the electrode pad 11 contacting the via wiring of the wiring layer 13) of the electrode pad 11 is covered by the projecting part 12p (insulating layer 12).

Hence, the wiring substrate 10 of the modified example of the first embodiment can attain substantially the same effects as those of the wiring substrate 10 of the first embodiment even where a portion of the side surface of the electrode pad 11 or the entire side surface of the electrode pad 11 is exposed from the projecting part 12p of the insulating layer 12.

<Second Embodiment>

In the following second embodiment of the present invention, a projecting part 12q having a shape different from the projecting part 12p of the first embodiment is described. In the second embodiment, like components are denoted with like reference numerals as of the reference numerals of the first embodiment and are not further explained.

Figure 14:
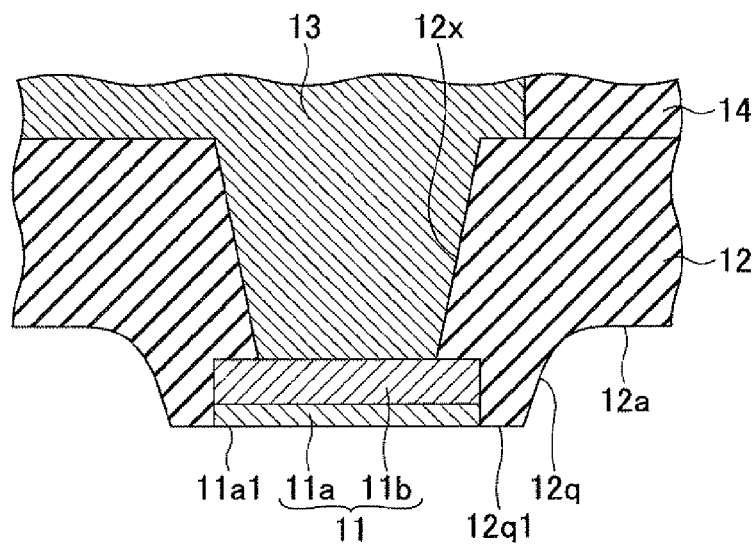

FIG. 14 is a cross-sectional view (example 3) corresponding to FIG. 2. With reference to FIG. 14, the projecting part 12q includes a lower surface 12q1 that is positioned on the same plane as the lower surface 11a1 of the plating film 11. From a plan view, the lower surface 12q1 of the projecting part 12q is formed in the periphery of the lower surface 11a1 of the plating film 11a.

The side surface of the electrode pad 11 (entire side surface of the plating film 11a and the entire side surface of the pad body 11b) is covered by the projecting part 12q.

In other words, although the lower surface of the electrode pad 11 (lower surface 11a1 of the plating film 11a) is exposed in the projecting part 12q of the insulating layer 12, the lower surface of the electrode pad 11 projects further outward (downward) than the lower surface 12a of the insulating layer 12. However, a portion of the side surface of the electrode pad 11 (toward the insulating layer 14) and the upper surface of the electrode pad 11 may be covered by a part other than the projecting part 12q of the insulating layer 12. That is, the upper surface of the electrode pad 11 may be positioned more toward the insulating layer 14 than the lower surface 12a of the insulating layer 12.

Figure 15:
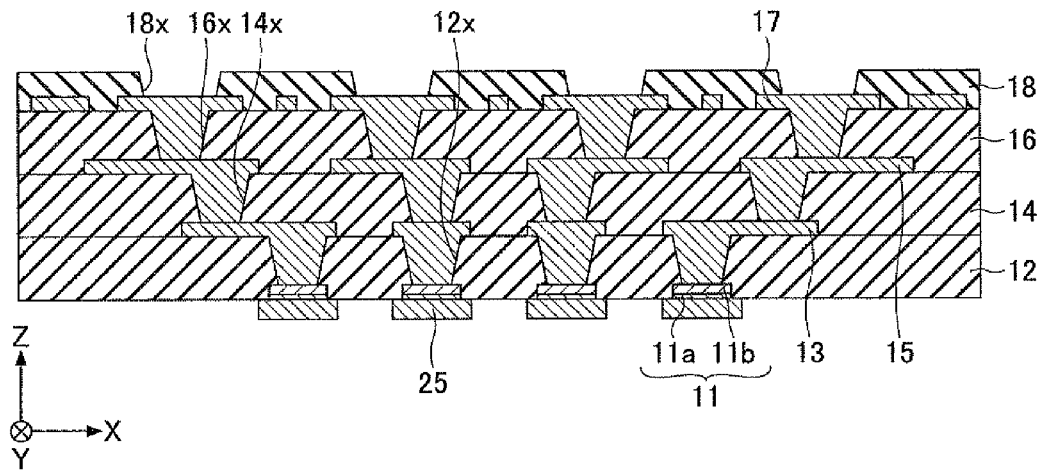
FIGS. 15-16 are schematic diagrams for describing the processes in manufacturing a wiring substrate according to a second embodiment of the present invention.

In order to form the projecting part 12q, first, the processes illustrated in FIGS. 3 to 11 of the first embodiment are performed. Then, in the process illustrated in FIG. 15, a resist layer 25 is formed, so that the resist layer 25 covers the exposed surface 11a1 of the plating film 11a and a part of the lower surface of the insulating layer 12 surrounding the periphery of the exposed surface 11a1 of the plating film 11a. The resist layer 25 can be formed by performing the same process used for forming the resist layer 22 illustrated in FIG. 3. The resist layer 25 is a representative example of a second resist layer according to an embodiment of the present invention.

Figure 16:
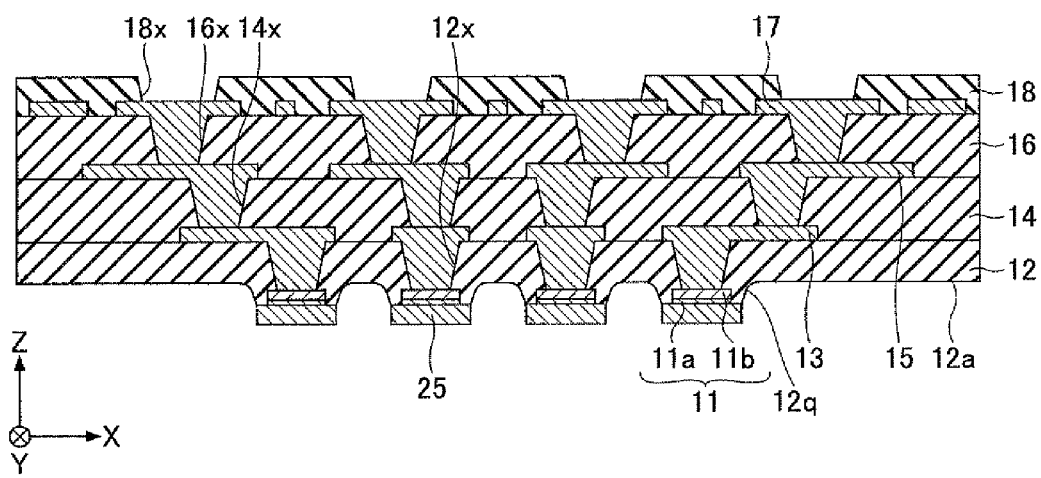

Then, in the process illustrated in FIG. 16, a part of the insulating layer 12 that is not covered by the resist layer 25 is removed. Thereby, the projecting part 12q including the lower surface 12q1 is formed. The lower surface 12q1 is formed in the periphery of the exposed surface 11a1 of the plating film 11a and is positioned on the same plane as the exposed surface 11a1 of the plating film 11a. After the process illustrated in FIG. 16, the remaining resist layer 25 is removed. Thereby, the forming of the projecting part 12q of FIG. 14 is completed.

In addition to the effects attained by the first embodiment of the present invention, the following effects can be attained by forming the lower surface 12q1 in the periphery of the exposed surface 11a1 of the plating film 11a and on the same plane as the exposed surface 11a1 of the plating film 11a.

That is, the side surface of the electrode pad 11 (entire side surface of the plating film 11a and entire side surface of the pad body 11b) can be surely covered by the resin material constituting the projecting part 12q. Therefore, melted bumps can be prevented from adhering to the side surface of the electrode pad 11 when bonding the electrode pad 11 and an electrode pad of a semiconductor chip with the bump.

Although a bump adhered to the side surface of the electrode pad 11 is not a significant problem from the standpoint of electric performance, it is preferable to prevent the bump from adhering to the side surface of the electrode pad 11, so that adjacent bumps can be prevented from contacting each other in a case where bumps are arranged in a narrow pitch. In other words, by forming the projecting part 12q including the lower surface 12q1, bonding with bumps can be performed even in a case where the bumps are to be arranged in a narrow pitch. The width of the lower surface 12q1 of the projecting part 12q is preferred to be a minimal width in order to achieve bonding in a case where bumps are arranged in a narrow pitch.

<Third Embodiment>

In the following third embodiment of the present invention, a projecting part 12r having a shape different from the projecting part 12*p* of the first embodiment is described. In the third embodiment, like components are denoted with like reference numerals as of the reference numerals of the first embodiment and are not further explained.

Figure 17:
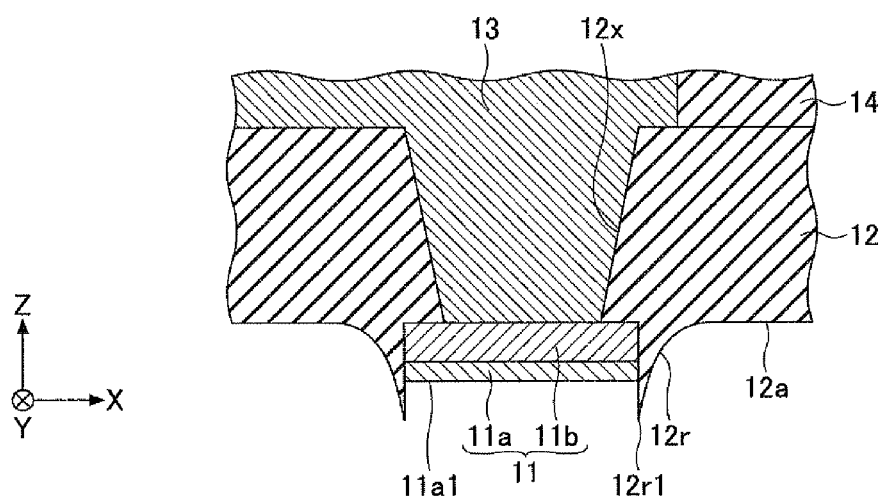
FIG. 17 is a cross-sectional view corresponding to FIG. 2 (example 4)

FIG. 17 is a cross-sectional view (example 4) corresponding to FIG. 2. With reference to FIG. 17, a tip of the projecting part 12*r* projects further outward (downward) than the lower surface 11*a*1 of the plating film 11*a*. That is, the lower surface 11*a*1 of the plating film 11*a* is in a position that is recessed more toward the insulating layer 14 than a part 12*r*1 of the projecting part 12*r* projecting farthest from the lower surface 12*a* of the insulating layer 12.

The side surface of the electrode pad 11 (entire side surface of the plating film 11*a* and the entire side surface of the pad body 11*b*) is covered by the projecting part 12*r*. Further, the upper surface of the electrode pad 11 (except for a part of the electrode pad 11 that contacts the via wiring of the wiring layer 13) is also covered by the projecting part 12*r*.

In other words, although the lower surface of the electrode pad 11 (lower surface 11*a*1 of the plating film 11*a*) is exposed in the projecting part 12*r* of the insulating layer 12, the lower surface of the electrode pad 11 projects further outward (downward) than the lower surface 12*a* of the insulating layer 12. However, a portion of the side surface of the electrode pad 11 (toward the insulating layer 14) and the upper surface of the electrode pad 11 may be covered by a part other than the projecting part 12*r* of the insulating layer 12. That is, the upper surface of the electrode pad 11 may be positioned more toward the insulating layer 14 than the lower surface 12*a* of the insulating layer 12.

Figure 18:
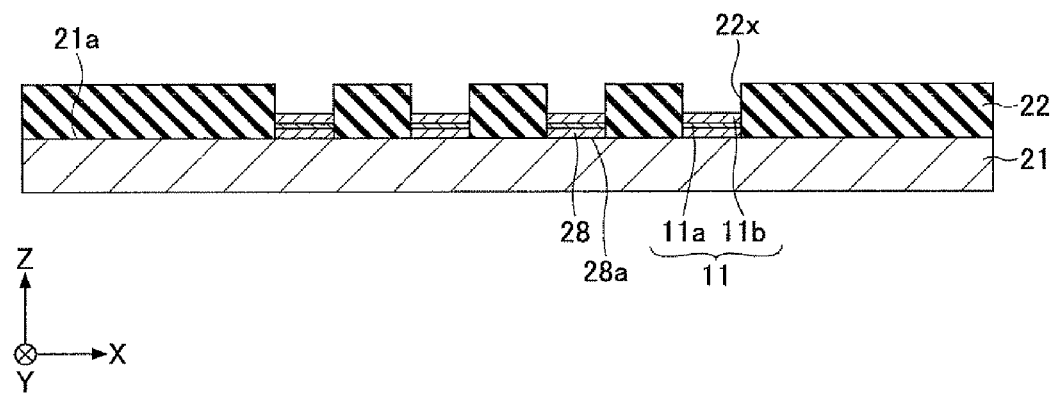
FIGS. 18-19 are schematic diagrams for describing the processes in manufacturing a wiring substrate according to a third embodiment of the present invention.

In order to form the projecting part 12*r*, first, the process illustrated in FIG. 3 of the first embodiment is performed. Then, in the process illustrated in FIG. 18, a barrier layer 28 is formed in the opening part 22*x* on the first surface 21*a* of the support body 21. The barrier layer 28 is formed by, for example, an electroplating method using the support body 21 as the power-feeding layer. Further, the electrode pad 11 including layers of the plating film 11*a* and the pad body 11*b* is formed on the barrier layer 28.

In order to prevent the barrier layer 28 from being removed at the same time of removing the support body 21, the barrier layer 28 is formed with a material different from the material of the support body 21. In a case where the support body 21 is formed of copper (Cu), the barrier layer 28 may be formed of a material (e.g., nickel (Ni)) that cannot be removed by an etching liquid capable of removing copper (Cu). The thickness of the barrier layer 28 may be, for example, approximately 0.5 µm to 5 µm.

Then, the processes illustrated in FIGS. 5-11 of the first embodiment are performed. Then, in the process illustrated in FIG. 19, the projecting part 12*r* is formed on the lower surface 12*a* of the insulating layer 12 by removing (e.g., etching) a part of the insulating layer 12 surrounding a periphery of an exposed surface (lower surface) 28*a* of the barrier layer 28. Thereby, the exposed layer 28*a* of the barrier layer 28 projects further outward (downward) than the lower surface 12*a* of the insulating layer 12.

Figure 19:
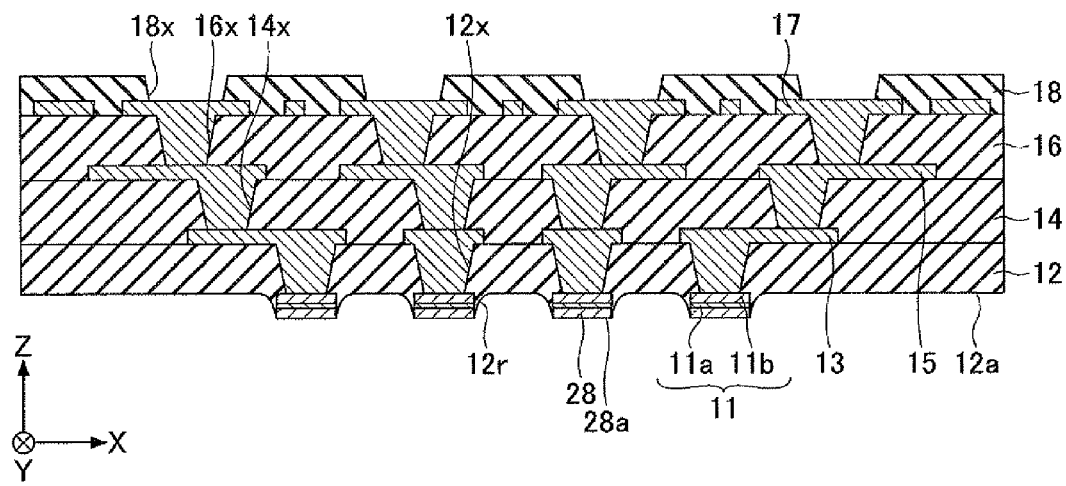

After the process illustrated in FIG. 19, the barrier layer 28 is removed. In a case where the barrier layer 28 is formed of nickel (Ni), an etching liquid capable of removing nickel (Ni) is used for removing the barrier layer 28. Thereby, the tip 12*r*1 of the projecting part 12*r* is formed projecting further outward (downward) than the lower surface 11*a*1 of the plating film 11*a*. That is, the lower surface 11*a*1 of the plating film 11*a* is in a position that is recessed more toward the insulating layer 14 than the tip 12*r*1 of the projecting part 12*r* projecting farthest from the lower surface 12*a* of the insulating layer 12.

In addition to the effects attained by the first embodiment of the present invention, the following effects can be attained by forming the tip 12*r*1 of the projecting part 12*r* that projects further outward (downward) than the lower surface of the electrode pad 11 (lower surface 11*a*1 of the plating film 11*a*).

That is, similar to the case of the projecting part 12*q*, the side surface of the electrode pad 11 can be surely covered by the resin material constituting the projecting part 12*r*. Therefore, bonding with bumps can be achieved even in a case where bumps are arranged in a narrow pitch. Further, because the tip 12*r*1 of the projecting part 12*r* projects from the periphery of the electrode pad 11, the positions of bumps can be defined by the tip 12*r*1 of the projecting part 12*r* when bonding the electrode pad 11 and an electrode pad of a semiconductor chip with the bumps. Therefore, bumps can be easily mounted on the electrode pads 11.

<Modified Example of Third Embodiment>

In a modified example of the third embodiment, the configuration illustrated in FIGS. 2, 12, and 13 may be formed with the process illustrated in FIG. 19 of the third embodiment.

In the process illustrated in FIG. 19, the amount in which a side surface of the barrier layer 28 or the side surface of the electrode pad 11 is exposed from the insulating layer 12 can be adjusted by adjusting the amount of laser irradiation or the amount of blasting performed on the insulating layer 12. After the process illustrated in FIG. 19, the barrier layer 28 is removed. Thereby, the configuration illustrated in FIGS. 2, 12, and 13 can be formed.

<Fourth Embodiment>

In the following fourth embodiment of the present invention, a projecting part 12*s* having a shape different from the projecting part 12*p* of the first embodiment is described. In the fourth embodiment, like components are denoted with like reference numerals as of the reference numerals of the first embodiment and are not further explained.

Figure 20:
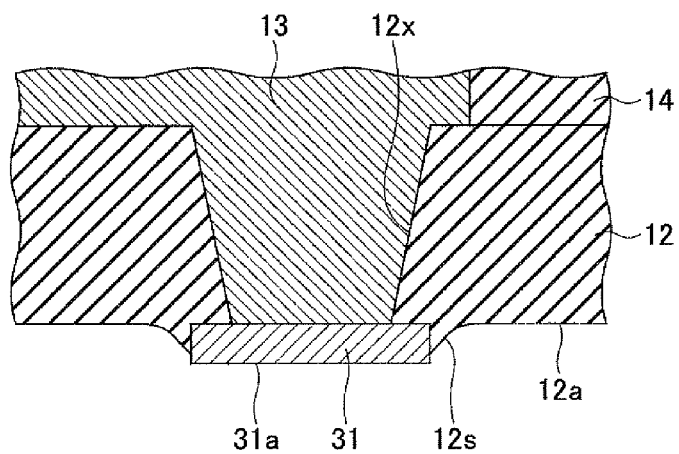
FIG. 20 is a cross-sectional view corresponding to FIG. 2 (example 5)

FIG. 20 is a cross-sectional view (example 5) corresponding to FIG. 2. With reference to FIG. 20, the fourth embodiment has an electrode pad 31 formed instead of the electrode pad 11. The electrode pad 31 is formed of a single layer. That is, no film corresponding to the plating film 11*a* of the electrode pad 11 is formed in the electrode pad 31. Thus, only a part corresponding to the pad body 11*b* of the electrode pad 11 is formed in the electrode pad 31. For example, the material of the electrode pad 31 may be, for example, copper (Cu). The thickness of the electrode pad 31 may be, for example, approximately 10 µm to 20 µm.

The electrode pad 31 is embedded in the projecting part 12*s* formed on the lower surface 12*a* of the insulating layer 12. The projecting part 12*s*, which is a part of the insulating layer 12, is formed integrally with other parts of the insulating layer 12. A lower surface 31*a* of the electrode pad 31 is exposed from the projecting part 12*s* of the insulating layer 12. Further, at least a part of the side surface of the electrode pad 31 is covered by the projecting part 12*s* of the insulating layer 12. Further, an upper surface of the electrode pad 13 (except for a part contacting the via wiring of the wiring layer 13) is covered by the projecting part 12*s*.

In other words, although the lower surface 31*a* of the electrode pad 31 is exposed in the projecting part 12*s* of the insulating layer 12, the lower surface 31*a* of the electrode pad 31 projects further outward (downward) than the lower surface 12*a* of the insulating layer 12. However, a portion of the side surface of the electrode pad 31 (toward the insulating layer 14) and the upper surface of the electrode pad 31 may be covered by a part other than the projecting part 12*s* of the insulating layer 12. That is, the upper surface of the electrode pad 31 may be positioned more toward the insulating layer 14 than the lower surface 12a of the insulating layer 12.

Figure 21:
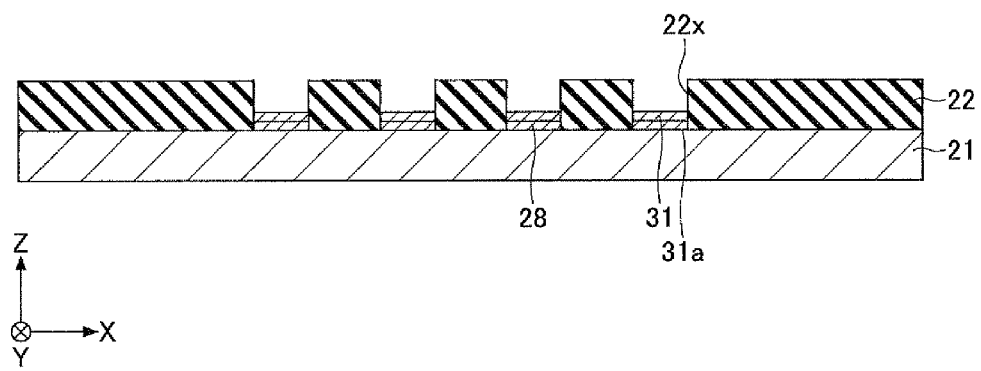
FIGS. 21-24 are schematic diagrams for describing the processes in manufacturing a wiring substrate according to a fourth embodiment of the present invention.
Figure 22:
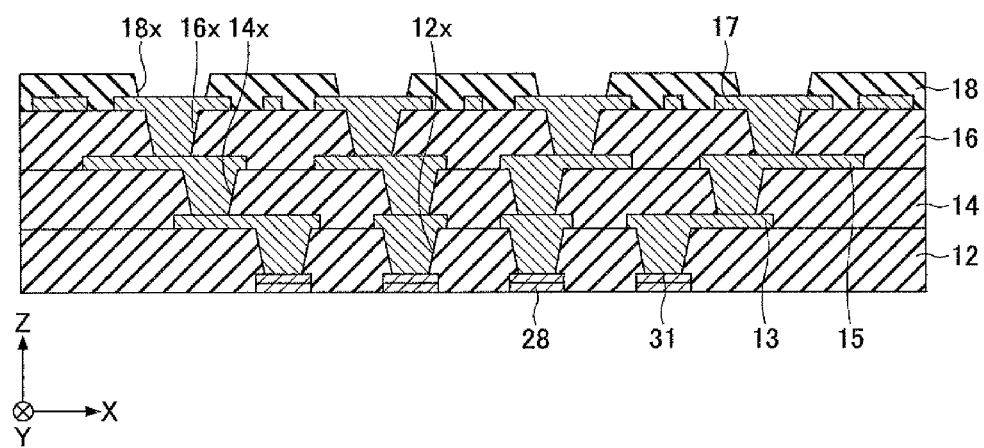

In order to form the projecting part 12s, first, the process illustrated in FIG. 3 of the first embodiment is performed. Then, in the process illustrated in FIG. 21, a barrier layer 28 is formed in the opening part 22x on the first surface 21a of the support body 21. The barrier layer 28 is formed by, for example, an electroplating method using the support body 21 as the power-feeding layer. Further, the electrode pad 31 is formed on the barrier layer 28 also by, for example, an electroplating method using the support body 21 as the power-feeding layer.

In order to prevent the barrier layer 28 from being removed at the same time of removing the support body 21, the barrier layer 28 is formed with a material different from the material of the support body 21. In a case where the support body 21 is formed of copper (Cu), the barrier layer 28 may be formed of a material (e.g., nickel (Ni)) that cannot be removed by an etching liquid capable of removing copper (Cu). The thickness of the barrier layer 28 may be, for example, approximately 0.5 μm to 5 μm. For example, the material of the electrode pad 31 may be copper (Cu). The thickness of the electrode pad 31 may be, for example, approximately 10 μm to 20 μm.

Then, by performing the processes illustrated in FIGS. 5-11 of the first embodiment, the support body 21 is removed. Thereby, the barrier layer 28 is exposed from a surface of the insulating layer 12 from which the support body 21 has been removed (i.e. lower surface 12a that had been contacting the support body 21 before removal of the support body 21).

Figure 23:
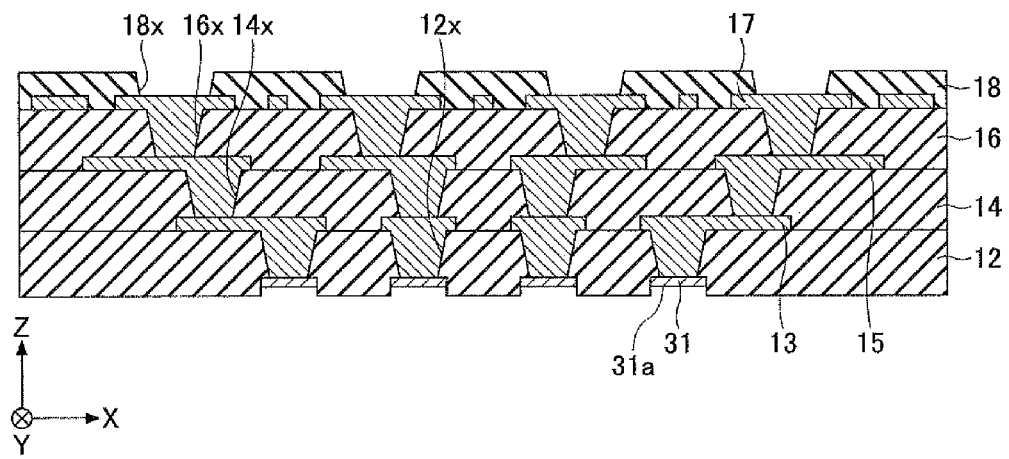

Then, in the process illustrated in FIG. 23, the barrier layer 28 is removed. In a case where the barrier layer 28 is formed of nickel (Ni), an etching liquid dedicated to remove nickel (Ni) is used for removing the barrier layer 28. Thus, in a case where the electrode pad 31 is formed of copper (Cu), the electrode pad 31 is prevented from being removed. Accordingly, the lower surface 31a of the electrode pad 31 is in a position that is recessed more toward the insulating layer 14 than a surface of the insulating layer 12 from which the support body 21 had been removed (i.e. the part of the lower surface 12a that had been contacting the support body 21 before removal of the support body 21).

Figure 24:
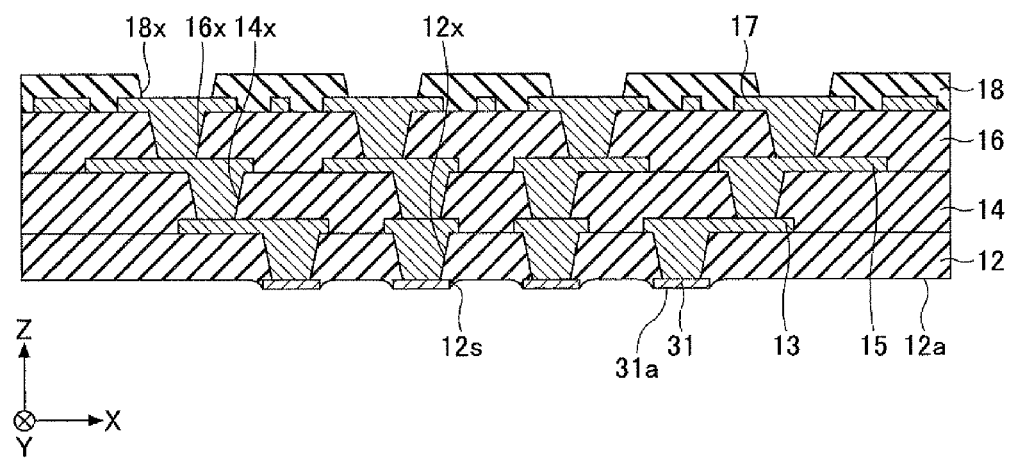

Then, in the process illustrated in FIG. 24, the thickness of a part of the insulating layer 12 surrounding the periphery of the lower surface 31a of the electrode pad 31 is reduced by grinding (e.g., blasting). As a result, the projecting part 12s is formed on the lower surface 12a of the insulating layer 12, and the lower surface 31a of the electrode pad 31 projects further outward (downward) than the lower surface 12a of the insulating layer 12.

Accordingly, similar to the first embodiment, connection reliability between the electrode pad 31 and a semiconductor chip or the like can be attained even in a case where the electrode pad 31 is formed with a single layer.

<Fifth Embodiment>

In the following fifth embodiment of the present invention, a projecting part 12t having a shape different from the projecting part 12p of the first embodiment is described. In the fifth embodiment, like components are denoted with like reference numerals as of the reference numerals of the first embodiment and are not further explained.

Figure 25:
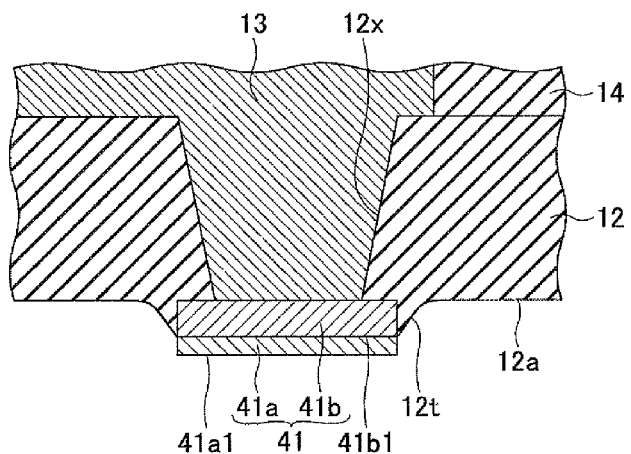
FIG. 25 is a cross-sectional view corresponding to FIG. 2 (example 6)

FIG. 25 is a cross-sectional view (example 6) corresponding to FIG. 2. With reference to FIG. 25, an electrode pad 41 includes a plating film 41a and a pad body 41b. The plating film 41a is formed on a lower surface of the pad body 41b. The plating film 41a is formed by using an electroless plating method. For example, the plating film 41a may be a tin (Sn) film formed by using an electroless plating method.

Alternatively, the plating film 41a may be a gold/nickel (Au/Ni) film (i.e. a film including a Au layer and a Ni layer layered in this order) formed by an electroless plating method in which the gold (Au) layer is exposed outward from the insulating layer 12. Alternatively, the plating film may be a gold/palladium/nickel (Au/Pd/Ni) layer (i.e. metal layer including a Au layer, a Pd layer, and a Ni layer layered in this order) formed by an electroless plating method in which the gold (Au) layer is exposed outward from the insulating layer 12.

For example, a conductive layer including copper (Cu) may be used as the pad body 41b. The thickness of the electrode pad 41 may be, for example, approximately 10 μm to 20 μm.

The electrode pad 41 is embedded in a projecting part 12t of the insulating layer 12. The projecting part 12t is a part of the insulating layer 12 that is integrally formed with other parts of the insulating layer 12. The lower surface of the electrode pad 41 (lower surface 41a1 of the plating film 41a) is exposed from the projecting part 12t of the insulating layer 12. Further, a side surface of the electrode pad 41 is covered by the projecting part 12t of the insulating layer 12. Although FIG. 25 illustrates a part of the side surface of the electrode pad 41 (side surface of the pad body 41b) covered by the projecting part 12t, the entire side surface of the electrode pad 41 (the entire side surface of the plating film 41a and the entire side surface of the pad body 41b) may be covered by the projecting part 12t. Further, an upper surface of the electrode pad 41 (except for a part contacting the via wiring of the wiring layer 13) is also covered by the projecting part 12t.

In other words, although the lower surface of the electrode pad 11 (lower surface 41a1 of the plating film 41a) is exposed from the projecting part 12t of the insulating layer 12, the lower surface of the electrode pad 41 projects further outward (downward) than the lower surface 12a of the insulating layer 12. However, a part of the side surface of the electrode pad 41 toward the insulating layer 14 and the upper surface of the electrode pad 41 may be covered by another part other than the projecting part 12t of the insulating layer 12. That is, the upper surface of the electrode pad 11 may be positioned more toward the insulating layer 14 than the lower surface 12a of the insulating layer 12.

In order to form the projecting part 12t, first, the processes illustrated in FIGS. 21 to 24 of the fourth embodiment are performed. Thereby, the projecting part 12t is formed in the lower surface 12a of the insulating layer 12 in which a lower surface 41b1 of the pad body 41b projects further outward (downward) than the lower surface 12a of the insulating layer 12.

Figure 26:
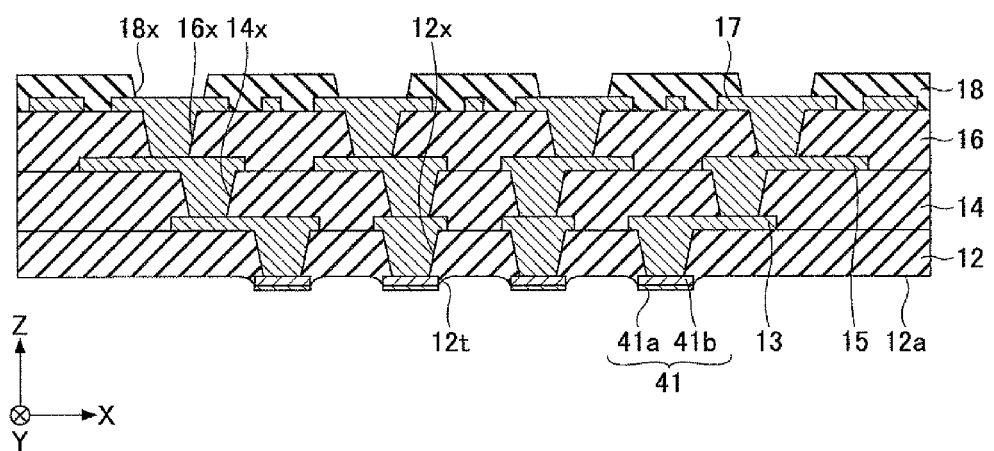
FIG. 26 is a schematic diagram for describing the processes in manufacturing a wiring substrate according to a fifth embodiment of the present invention.

Then, in the process illustrated in FIG. 26, the plating film 41a is formed on the lower surface 41b1 of the pad body 41b by using an electroless plating method. Thereby, the forming of the electrode pad 41 of FIG. 25 is completed.

Alternatively, an OSP (Organic Solderability Preservatives) film can be formed instead of the plating film 41a formed by the electroless plating method.

Hence, the fifth embodiment can attain substantially the same effects as those of the first embodiment even where the plating film 41a or the OSP film is formed on the lower surface 41b1 of the pad body 41b. The connection reliability between the electrode pad 41 and a semiconductor chip or the like can be improved.

<Sixth Embodiment>

In the first embodiment, the side toward the electrode pad 11 corresponds to the side of the wiring substrate 10 on which a semiconductor chip is mounted, and the side toward the electrode pad 17 corresponds to the side of the wiring substrate 10 on which a mounting substrate (e.g., motherboard) is mounted. In the following sixth embodiment, a side toward the electrode pad 11 corresponds to a side of a wiring substrate 10A on which a mounting substrate (e.g., motherboard) is mounted, and a side toward the electrode pad 17 corresponds to a side of the wiring substrate 10A on which a semiconductor chip is mounted. In the sixth embodiment, like components are denoted with like reference numerals as of the reference numerals of the first embodiment and are not further explained.

Figure 27:
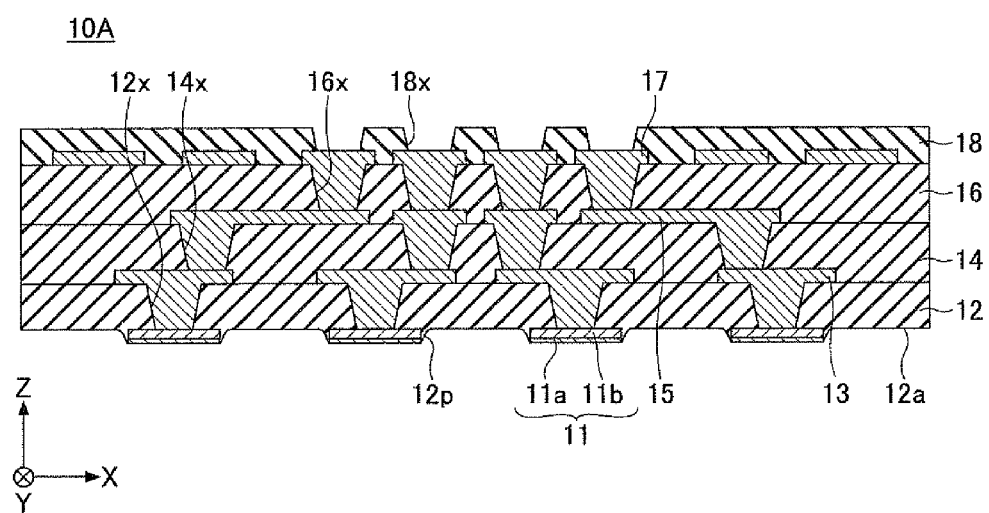
FIG. 27 is a schematic diagram illustrating a wiring substrate according to a sixth embodiment of the present invention.

FIG. 27 is a cross-sectional view illustrating the wiring substrate 10A according to the sixth embodiment of the present invention. As illustrated in FIG. 27, similar to the wiring substrate 10 (see FIG. 1), the wiring substrate 10A of the sixth embodiment is a coreless built-up wiring substrate including, for example, an electrode pad 11, an insulating layer 12, a wiring layer 13, an insulating layer 14, a wiring layer 15, an insulating layer 16, a wiring layer 17, and a solder resist layer 18.

However, in the wiring substrate 10A, the side toward the electrode pad 11 corresponds to the side of the wiring substrate 10A on which a mounting substrate (e.g., motherboard) is mounted (mounting substrate side), and the side toward the electrode pad 17 corresponds to the side of the wiring substrate 10A on which a semiconductor chip is mounted (semiconductor chip side). The pitch between adjacent electrode pads 11 may be, for example, approximately 500 μm to 1200 μm. The pitch between adjacent electrode pads 17 may be narrower than the pitch of the electrode pads 11. For example, the pitch between adjacent electrode pads 17 may be approximately 100 μm to 200 μm.

Other than difference of the pitch between the electrode pads 11, 17, and the position of the via holes of the wiring substrates 10, 10A, the method for manufacturing the wiring substrate 10 and the method for manufacturing the wiring substrate 10A are substantially the same.

Hence, the wiring substrate 10A of the sixth embodiment can attain substantially the same effects as those of the wiring substrate 10 of the first embodiment even where the side toward the electrode pad 11 corresponds to the side of the wiring substrate 10A on which a mounting substrate (e.g., motherboard) is mounted (mounting substrate side), and the side toward the electrode pad 17 corresponds to the side of the wiring substrate 10A on which a semiconductor chip is mounted (semiconductor chip side).

<Seventh Embodiment>

The following seventh embodiment illustrates a semiconductor package having a semiconductor chip mounted on the wiring substrate 10 (see FIG. 1) of the first embodiment. In the seventh embodiment, like components are denoted with like reference numerals as of the reference numerals of the first embodiment and are not further explained.

Figure 28:
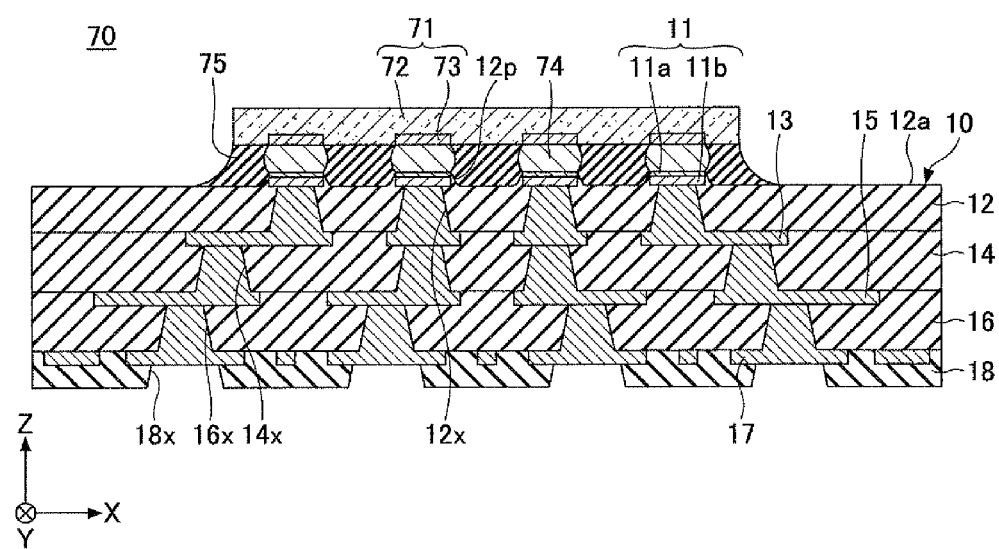
FIG. 28 is a cross-sectional view illustrating a semiconductor package according to a seventh embodiment of the present invention (example 1)

FIG. 28 is a cross-sectional view (example 1) illustrating a semiconductor package 70 according to the seventh embodiment. With reference to FIG. 28, the semiconductor package 70 includes, for example, the wiring substrate 10 of FIG. 1, a semiconductor chip 71, a bump 74, and an underfill resin 75. It is to be noted that FIG. 28 illustrate a state in which the wiring substrate 10 is flipped vertically (i.e. upside down) with respect to the embodiment illustrated in FIG. 1.

The semiconductor chip 71 includes, for example, a main body 72 and an electrode pad 73. For example, the main body 72 may be a semiconductor substrate (not illustrated) on which a semiconductor integrated circuit (not illustrated) is formed. The semiconductor substrate may be a silicon substrate having a reduced thickness. The electrode pad 73 is formed on the main body 72. The electrode pad 73 is electrically connected to a semiconductor integrated circuit (not illustrated). For example, aluminum (Al) may be used as the material of the electrode pad 73.

The bump 74 electrically connects the electrode pad 73 of the semiconductor chip 71 and the electrode pad 11 (exposed surface 11a1 of the plating film 11a) exposed from the projecting part 12p of the wiring substrate 10 by bonding to the electrode pad 73 of the semiconductor chip 71 and the electrode pad 11 of the wiring substrate 10. The bump 74 may be, for example, a solder bump. The material of the solder bump may be, for example, an alloy including lead (Pb), an alloy including tin (Sn) and copper (Cu), an alloy including tin (Sn) and silver (Ag), or an alloy including tin (Sn), silver (Ag), and copper (Cu). The underfill resin 75 is filled between the semiconductor chip 71 and a first surface of the wiring substrate 10.

In the semiconductor package 70, the bump 74 can be prevented from being formed on the side surface of the electrode pad 11 because the side surface of the electrode pad 11 is covered by the projecting part 12p. Therefore, adjacent bumps 74 can be prevented from contacting each other even in a case where the bumps 74 are arranged in a narrow pitch. Further, space between adjacent bumps 74 can easily be obtained, the underfill resin 75 can easily be filled and manufacturing cost of the semiconductor package 70 can be reduced because the amount of material used for forming the bumps 74 can be reduced.

Figure 29:
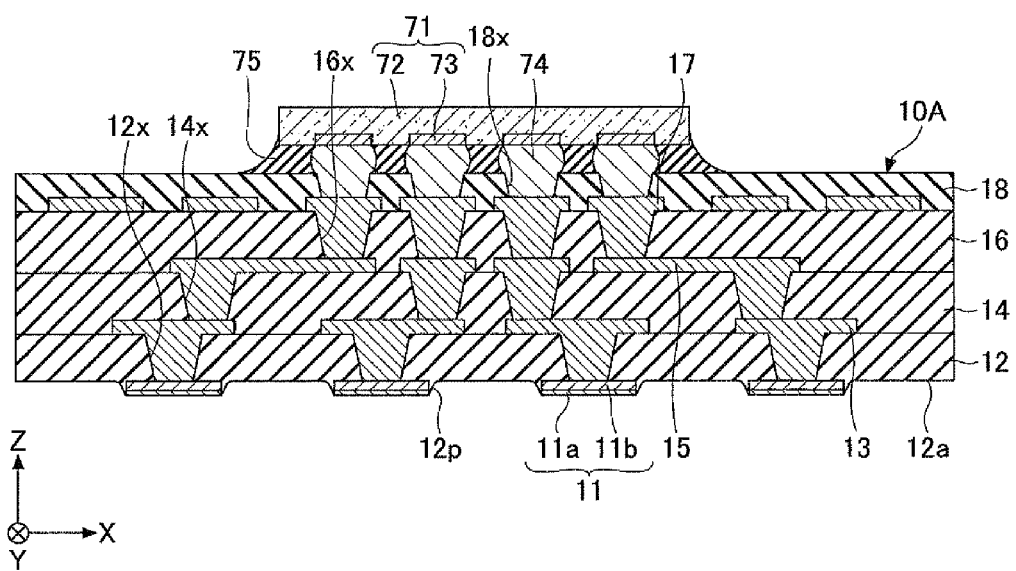
FIG. 29 is a cross-sectional view illustrating another semiconductor package according to a seventh embodiment of the present invention (example 2).

FIG. 29 is a cross-sectional view (example 2) illustrating another semiconductor package 80 according to the seventh embodiment. The semiconductor package 80 may have the semiconductor chip 71 mounted on the wiring substrate 10A of the sixth embodiment as illustrated in FIG. 29. The semiconductor chip 71 is connected to the electrode pad 11 by the bump 74.

In the semiconductor package 80, the bump can be prevented from being formed on the side surface of the electrode pad 11 in a case of connecting the electrode pad 11 to a mounting substrate (e.g., motherboard) because the side surface of the electrode pad 11 is covered by the projecting part 12p. Therefore, the amount of material used for forming the bumps can be reduced.

Although not illustrated in the drawings, the semiconductor chip 71 may be mounted on the wiring substrates of the second and the third embodiments as well as the modified example of the first embodiment.

Accordingly, with the seventh embodiment, the semiconductor package 70, 80 having a semiconductor chip 71 mounted on the wiring substrate 10, 10A can be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wiring substrate comprising:
an insulating layer having a first surface on which a projecting part is formed;

an electrode pad being formed on the projecting part and including a first electrode pad surface and a second electrode pad surface on a side opposite to the first electrode pad surface;

a via wiring connected to the second electrode pad surface;

a through-hole formed in the insulating layer, the through-hole penetrating the insulating layer, exposing the second electrode pad surface, and having the via wiring formed therein; and a metal layer extending from the through-hole to a second surface of the insulating layer opposite to the first surface of the insulating layer;

wherein the metal layer includes the via wiring formed in the through-hole and a wiring pattern formed on the second surface of the insulating layer, wherein the first electrode pad surface is exposed from the projecting part of the insulating layer, wherein the first electrode pad surface is flat and parallel with the first surface of the insulating layer, wherein the second electrode pad surface is covered by the insulating layer, wherein a cross-section of the projecting part is a tapered shape, wherein one side of the cross-section toward the first electrode pad surface is narrower than another side of the cross-section toward the first surface of the insulating layer, wherein the insulating layer and the projecting part are integrally formed with the same insulating resin, wherein a side surface of the electrode pad is exposed from the projecting part.

2. The wiring substrate as claimed in claim 1, wherein a multilayer structure including a wiring layer and another insulating layer is formed on the second surface of the insulating layer.

3. A semiconductor package comprising:

the wiring substrate of claim 1.

4. A wiring substrate comprising:

an insulating layer having a first surface on which a projecting part is formed;

an electrode pad being formed on the projecting part and including a first electrode pad surface and a second electrode pad surface on a side opposite to the first electrode pad surface;

a via wiring connected to the second electrode pad surface;

a through-hole formed in the insulating layer, the through-hole penetrating the insulating layer, exposing the second electrode pad surface, and having the via wiring formed therein; and a metal layer extending from the through-hole to a second surface of the insulating layer opposite to the first surface of the insulating layer;

wherein the metal layer includes the via wiring formed in the through-hole and a wiring pattern formed on the second surface of the insulating layer, wherein the first electrode pad surface is exposed from the projecting part of the insulating layer, wherein the first electrode pad surface is flat and parallel with the first surface of the insulating layer, wherein the second electrode pad surface is covered by the insulating layer, wherein a cross-section of the projecting part is a tapered shape, wherein one side of the cross-section toward the first electrode pad surface is narrower than another side of the cross-section toward the first surface of the insulating layer, wherein the insulating layer and the projecting part are integrally formed with the same insulating resin, wherein at least a part of a side surface of the electrode pad is covered by the projecting part.

5. The wiring substrate as claimed in claim 4, wherein an entire surface of the side surface of the electrode pad is covered by the projecting part.

6. The wiring substrate as claimed in claim 5, wherein the projecting part includes a first projecting surface that is positioned on a same plane as the first electrode pad surface, wherein the first projecting surface of the projecting part is formed in a periphery of the first electrode pad surface in a plan view.

7. The wiring substrate as claimed in claim 5, wherein the first electrode pad surface is in a position that is more recessed with respect to a tip of the projecting part projecting farthest from the first surface of the insulating layer.

8. The wiring substrate as claimed in claim 4, wherein a multilayer structure including a wiring layer and another insulating layer is formed on the second surface of the insulating layer.

9. A semiconductor package comprising:

the wiring substrate of claim 4.

* * * * *